United States Patent
Shum

(10) Patent No.: US 8,558,249 B1
(45) Date of Patent: Oct. 15, 2013

(54) RECTIFIER STRUCTURES FOR AC LED SYSTEMS

(75) Inventor: Frank Shum, Sunnyvale, CA (US)

(73) Assignee: Applied Lighting Solutions, LLC, Alameda, CA (US)

( * ) Notice: Subject to any disclaimer, the term of this patent is extended or adjusted under 35 U.S.C. 154(b) by 325 days.

(21) Appl. No.: 12/494,685

(22) Filed: Jun. 30, 2009

(51) Int. Cl.
*H01L 29/18* (2006.01)
*H01L 33/00* (2010.01)

(52) U.S. Cl.
USPC .......................................... 257/88; 257/100

(58) Field of Classification Search
USPC ................................................. 257/88, 100
See application file for complete search history.

(56) References Cited

U.S. PATENT DOCUMENTS

| | | | |
|---|---|---|---|
| 3,869,641 A | 3/1975 | Goldberg | |
| 5,463,280 A | 10/1995 | Johnson | |
| 5,688,042 A | 11/1997 | Madadi | |
| 5,936,599 A | 8/1999 | Reymond | |
| 6,054,716 A | 4/2000 | Sonobe | |
| 6,636,027 B1 | 10/2003 | Nerone | |
| 7,025,473 B2 | 4/2006 | Dokoupil | |
| 7,148,515 B1 | 12/2006 | Huang | |
| 7,210,819 B2 | 5/2007 | Jiang | |
| 7,213,942 B2 | 5/2007 | Jiang | |
| 7,417,259 B2 | 8/2008 | Sakai | |
| 7,489,086 B2 | 2/2009 | Miskin | |
| 7,728,346 B2 * | 6/2010 | Takikawa | 257/99 |
| 7,934,852 B2 * | 5/2011 | Allen et al. | 362/249.02 |
| 8,080,819 B2 * | 12/2011 | Mueller et al. | 257/13 |
| 2006/0022214 A1 * | 2/2006 | Morgan et al. | 257/99 |
| 2006/0044864 A1 | 3/2006 | Lin | |
| 2006/0071806 A1 | 4/2006 | Hollnberger | |
| 2006/0138971 A1 | 6/2006 | Uang | |
| 2006/0139920 A1 * | 6/2006 | Allen | 362/249 |
| 2006/0163589 A1 | 7/2006 | Fan | |
| 2006/0199304 A1 * | 9/2006 | Ng | 438/106 |
| 2008/0179603 A1 | 7/2008 | Sakai | |
| 2008/0180044 A1 | 7/2008 | Li | |
| 2008/0218093 A1 | 9/2008 | Lin | |
| 2008/0230765 A1 | 9/2008 | Yoon | |
| 2010/0109030 A1 * | 5/2010 | Krames et al. | 257/93 |
| 2010/0140630 A1 * | 6/2010 | Hamaguchi et al. | 257/79 |
| 2010/0244731 A1 * | 9/2010 | Kaihotsu et al. | 315/294 |

FOREIGN PATENT DOCUMENTS

DE     2304620 A1    8/1974

* cited by examiner

*Primary Examiner* — Ngan Ngo
(74) *Attorney, Agent, or Firm* — Aka Chan LLP

(57) ABSTRACT

A space efficient arrangement of at least one LED with a rectifying element and a current limiting element forms a compact module that can be powered using an AC voltage source.

20 Claims, 12 Drawing Sheets

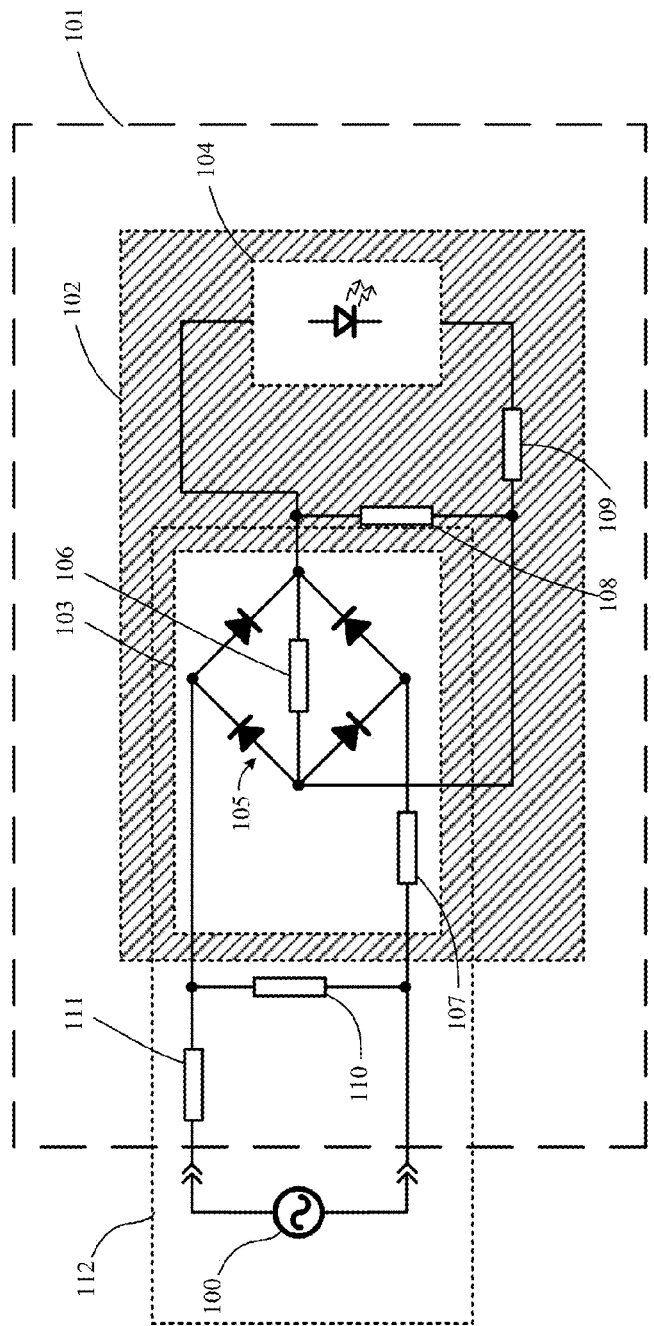
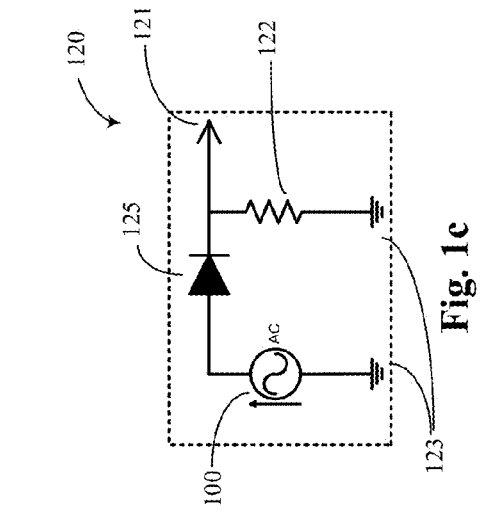
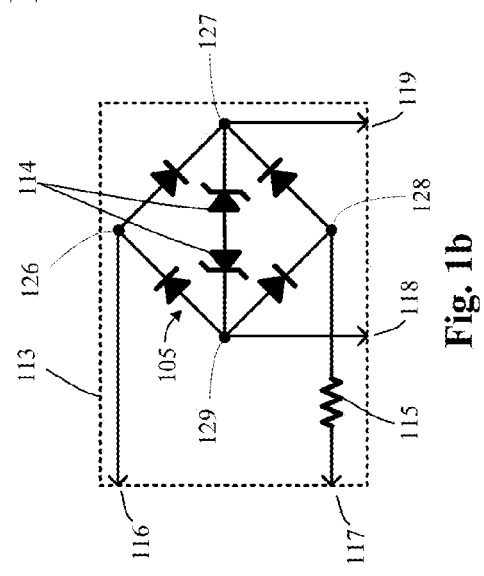
Fig. 1a
Fig. 1b
Fig. 1c

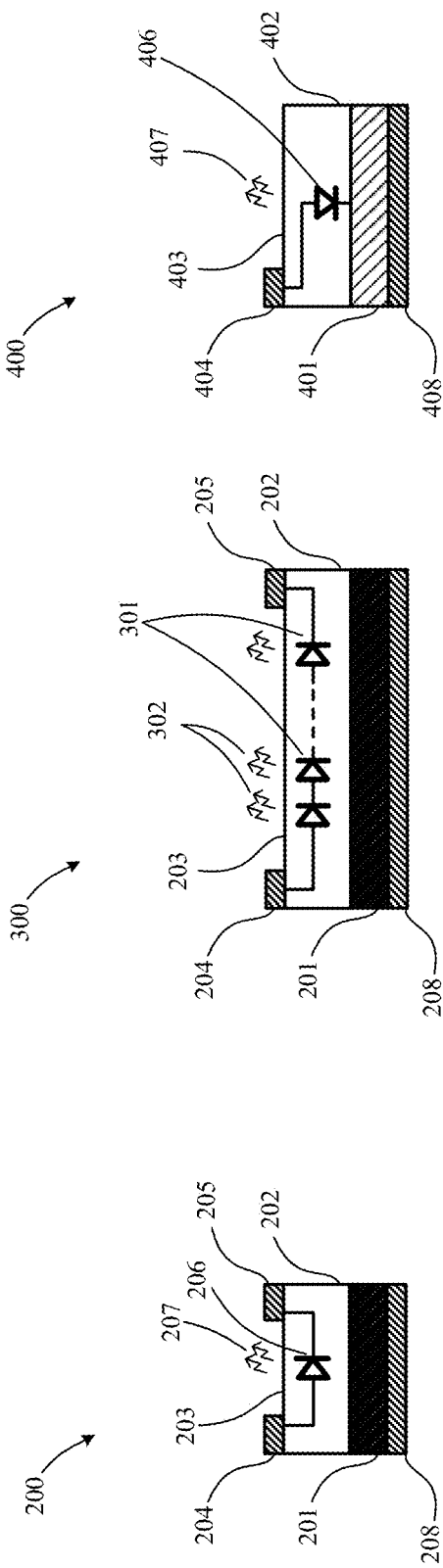

$$V_{LE} \geq fV_{SP}$$

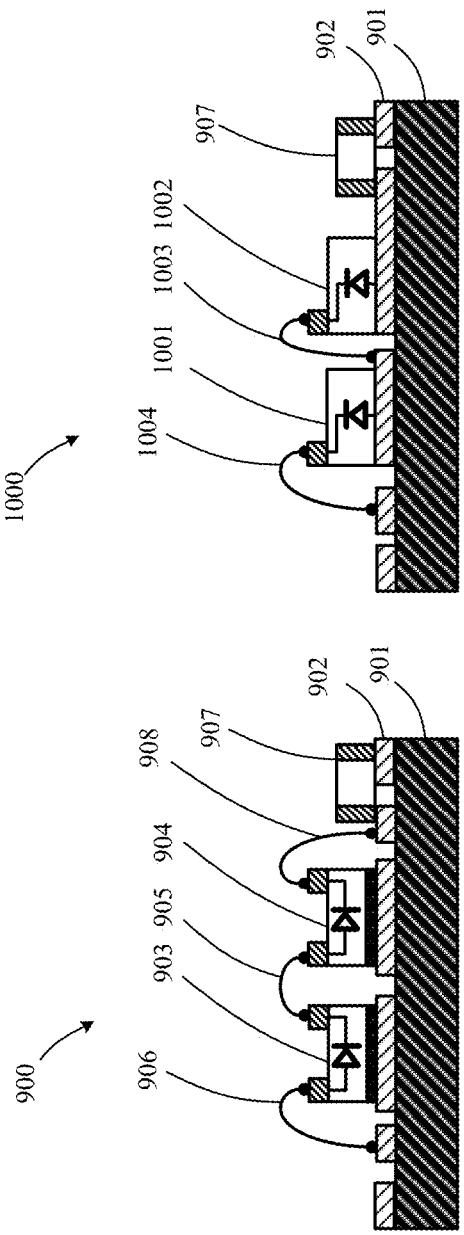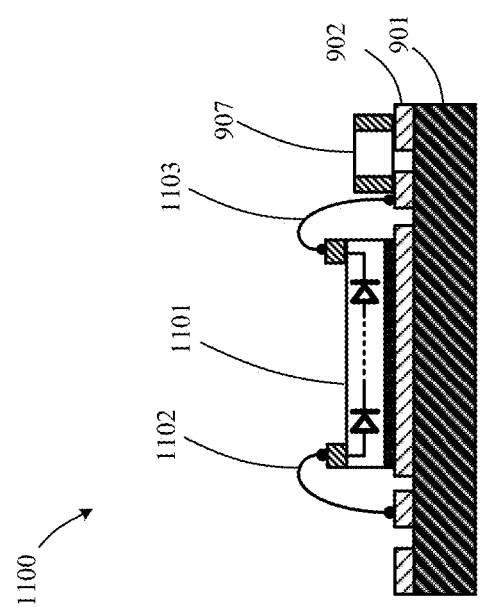

RECTIFIER STRUCTURES FOR AC LED SYSTEMS

BACKGROUND OF THE INVENTION

This invention relates to the field of lighting and illumination. More particularly, this invention relates to a technique to increase the efficiency of power electronics for light emitting diodes.

Since the development of the incandescent light bulb, electric lighting has become widely adopted and is considered one of the inventions which has had the most profound impact on human society. Lighting allows people to do many activities in the night hours which they would otherwise not be able to do without such lighting. Modern society depends on electric lighting.

Despite the success of modern electric lighting, there continues to be a need for improvements in electric lighting. For example, it is desirable to increase lighting brightness, improve efficiency, reduce power consumption, reduce heat output, and improve other characteristics of lighting sources.

LEDs outperform traditional lighting such as incandescent, fluorescent, or high intensity discharge (HID) lighting in power efficiency and or longevity. Although LEDs have been used as indicator lights, traffic signals, car tail lights, and similar applications, LEDs are generally not being used for general illumination due to a number of problems.

Some challenges to the adoption of LEDs for general illumination include the color or color temperature of LED illumination, brightness over time, power requirements, and high cost. Compared to incandescent and other lighting which use alternating current (AC) power, LEDs use direct current (DC) power. So, an LED lighting system need extra space to accommodate power electronics or power supply that converts AC power to DC power. In LED versions of incandescent lamps with form factors such as A, PAR, MR, R, BR, the need to accommodate the extra electronics is a major challenge.

Therefore, there is a need for LED lighting systems packaged with compact power electronics.

BRIEF SUMMARY OF THE INVENTION

A space efficient arrangement of at least one LED with a rectifying element and a current limiting element forms a compact module that can be powered using an AC voltage source.

In one embodiment, a bare silicon die containing the rectifying element is assembled with at least one LED to produce a compact module that can be powered with an AC voltage. In another embodiment, at least two LEDs are packaged together with an external rectifying element and a current limiting element to produce a compact module that can be powered with an AC voltage.

Additionally, this invention elaborates on how further space saving and assembly simplicity can be accomplished by incorporating additional functionality into the silicon rectifier die such as electrostatic discharge diodes (ESD diodes), limiting resistors, Zener diodes, surge protectors, and others.

In an implementation, a system includes: a first die including a light emitting diode with a light emitting surface; and a second die including a rectifier, where the rectifier of the second die is electrically connected to the light emitting diode of the first die. An encapsulation material is formed over the first and second dies, where the encapsulation material is a light transmitting medium.

In various embodiments, the first die is mounted on the second die. The first die includes at least one electrical contact on the light emitting surface. The second die is electrically connected to one electrical contact on the light emitting surface via a wire bond or other electrically conducted path. The second die can include at least one electric static discharge (ESD) protection diode. The second die can include at least one resistor. The first die includes at least two light emitting diodes.

The system can further include a third die including a light emitting diode, where the first and third dies are electrically connected together (e.g., via wire bond). The rectifying element can be fabricated from a silicon material.

In an implementation, a system including a packaged component includes: an AC power input to the packaged component; a first die including a first light emitting diode; a second die including a second light emitting diode; and a third die including a rectifier. The third die is electrically connected to the first and second die. The first and second dies are electrically connected to have or produce a combined forward voltage greater than the forward voltage either the first or second die. There is a current limiting element including a first terminal connected to the AC power input and a second terminal connected to the rectifying element.

In an implementation, a system includes a packaged component including: an AC power input to the packaged component; a first light emitting diode and a second light emitting diode on a first die, where the first and second light emitting diodes are electrically connected together. A rectifying element is connected to the first light emitting diode. And a current limiting element, having one terminal connected to the AC power input and a second terminal connected to the rectifying element.

The current limiting element can be a resistor. The current limiting element can be a capacitor. The first and second dies and the rectifying element are encapsulated together using a light transmitting medium.

The first and second dies are encapsulated together using a first medium and the rectifying element is encapsulated using a second medium, where the second medium is separate from the first medium.

In various implementations, the first medium can be light transmitting, while the second medium not light transmitting. The first die and the rectifying element are encapsulated together using a light transmitting medium. The first die is encapsulated using a first medium and the rectifying element is encapsulated using a second medium, where the second medium is separate from the first medium. The first and second light emitting diodes are connected together in series. The first and second light emitting diodes can be connected together in parallel.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1a is a schematic of the LED module of an alternating current drive circuit, constructed according to one embodiment of the invention, for supplying power to LEDs. FIG. 1b shows is a schematic of a full-wave rectifying element implementation. FIG. 1c shows a schematic for a half-wave rectifying element implementation.

FIG. 2 is a schematic of the functional components of a single lateral-structure LED formed on a semiconductor die.

FIG. 3 is a schematic of the functional components of multiple lateral-structure LEDs formed on a single semiconductor die.

FIG. 4 is a schematic of the functional components of a single vertical-structure LED formed on a semiconductor die.

FIG. 9 is a diagram of another embodiment of the invention, containing multiple semiconductor dies, each with a lateral structure LED.

FIG. 10 is a diagram, similar to FIG. 9, of a LED system containing multiple semiconductor dies, each with a vertical structure LED, mounted on a silicon die.

FIG. 11 is a diagram, similar to FIG. 9, of a LED system containing a semiconductor die with multiple lateral structure LEDs, mounted on a silicon die.

DETAILED DESCRIPTION OF THE INVENTION

Figure 5C:
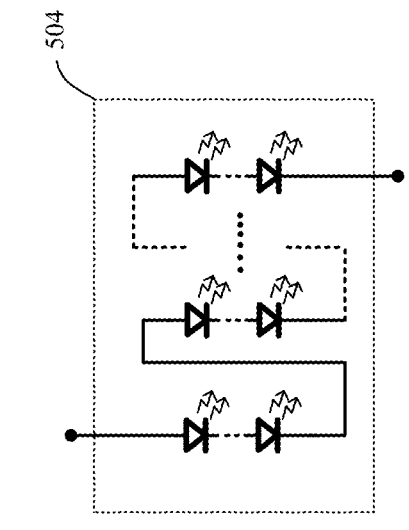
FIGS. 5a-5e show an example schematics of four alternative ways in which the LEDs of FIG. 4 may be arranged: in parallel, series, or a combination of both.
Figure 5B:
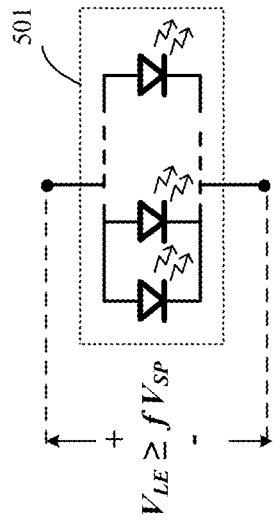
Figure 5E:
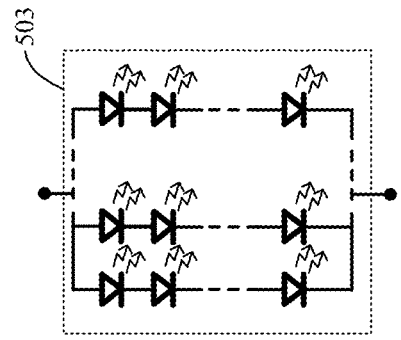
Figure 5A:
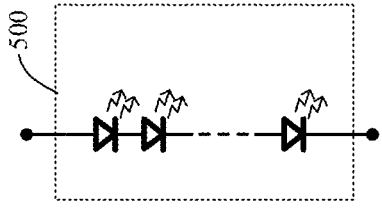
Figure 5D:
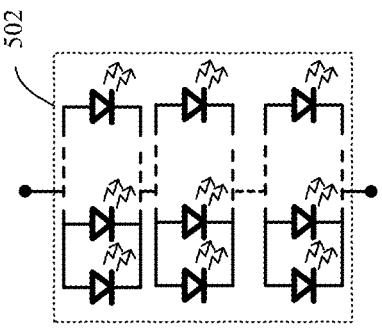

It is the object of this invention to provide a compact scheme to accommodate LEDs, rectifier and their associated components.

FIG. 1a is a schematic diagram showing a light emitting diode (LED) or light emitting element module 101 according to one embodiment of the present invention. LED module 101 contains an arrangement of LEDs 104 with at least one LED, and a bare silicon die 103 containing a rectifying element 105. Arrangement of LEDs 104 and bare silicon die 103 are encapsulated within a light-transmitting medium 102. Arrangement of LEDs 104 contains at least one semiconductor die, which contains at least one LED. By incorporating bare silicon die 103 and the LED semiconductor die together, the size of the system is reduced.

Optional components 106 and 107 such as ESD diodes, resistors, and capacitors may be formed on bare silicon die 103 along with rectifying element 105. There may also be other components 108 or 109 such as capacitors, inductors, resistors, and diodes outside silicon die 103, but within light-transmitting medium 102. Optionally, there may be components 110 or 111 such as resistors, capacitors, and inductors, outside light-transmitting medium 102, but within LED module 101. The consolidation of these additional components, enables further space and cost saving. An external alternating current (AC) power source 100 with two inputs is electrically connected to power LED module 101.

FIG. 1b shows another embodiment of rectifying element 105 from FIG. 1a, fabricated on silicon die 103. Rectifying element 105 can be a full- or a half-wave rectifier. In this example, silicon die 113 with a full-wave rectifier also contains a resistor 115, and Zener diodes 114 connected in series and of opposite polarity at the outputs 118 119 for ESD protection. If there are resistors, they are connected between the input 116 or 117 and one of the input nodes 126 or 128. If there are Zener diodes, they should be connected between the output nodes 129 and 127. One example is connecting two Zener diodes of opposite orientation in series. The silicon die has electrical contact inputs 116 and 117 and outputs 118 and 119 to allow for external electrical connections.

Full-wave rectifier 105 may be replaced by a half-wave rectifier, such as the one pictured in FIG. 1c. This is done by replacing region 112 by the module 120. The half-wave rectifier is formed by connecting AC source 100, a diode 125, and an equivalent resistor 122. Equivalent resistor 122 is optional and can be omitted. The positive end of AC source 100 is connected to the positive end of diode 125. The negative end of AC source 100 is connected to the ground 123. The negative end of diode 125 is connected to one end of resistor 122. The other end of resistor 122 is connected to ground 123. The output 121 goes to arrangement of LEDs 104 as before.

Arrangement of LEDs 104 is intended to be very general with no restriction on the type of LEDs, mixture of different LEDs, type or mixture of packaging, arrangement of electrical connections, and others. This will be discussed in FIG. 5.

The LED can be fabricated of any semiconducting material, as long as the passage of electricity through the diode junction (104) results in the emission of light. For example, the LED semiconducting material may consist of compounds composed of group III (e.g., aluminum, gallium, and indium) and group V elements (e.g., phosphorous, arsenic, and antimony).

FIGS. 2-4 show examples of LED device structures, in which the light emitting surface also has at least one electrical contact 204, 205, or 404. The contacts may be formed during microfabrication by using photolithography to create a window, leaving behind the two "islands" that are the metal contacts. A standard fabrication process for creating the metal contacts and the remainder of aspects of FIGS. 2 through 4 may be used.

FIG. 2 shows a single lateral structure LED 206 formed on the semiconductor die 200. The semiconductor die 200 contains a layer of semiconductor material 202 and an electrically insulating layer 201 on which may be attached a lower metal layer 208. The light transmitting surface 203 permits light to be emitted 207. The light transmitting surface also has two electrical contacts 204 and 205. Light may be generated when electricity is passed between contacts 204 and 205, and there is a proper bias meeting the forward voltage requirement of LED 206. Lower metal layer 208 is optional and is suitable for soldering. For example, the materials selected may be gallium nitride (GaN) for semiconducting layer 202, sapphire for insulating layer 201, chromium or titanium over coated with nickel then gold for bottom metal layer 208, and chromium coated with nickel and gold for electrical contacts 204 and 205. FIG. 2 is intended to show the schematic functional components but not the internal semiconducting layers.

FIG. 3 shows an alternate implementation of a LED similar to 200, except in this implementation, the semiconductor die 300 contains more than one lateral structure LED 301. Like 200, the semiconductor die 300 has a light transmitting surface 203, that permits light be emitted 302 when the proper bias is applied using electrical contacts 204 and 205 located on light transmitting surface 203. The exact electrical connections between the LEDs 301 is intended to be very general such as but not limited to the series, parallel, and a combination of series and configuration shown in FIG. 5 and discussed below. Forming multiple LEDs 301 in series on a single semiconductor die may be used to increase the forward voltage of the device in a very compact space. FIG. 3 is intended to show the schematic functional components but not the internal semiconductor layers.

FIG. 4 shows an implementation of a semiconductor die containing a vertical structure LED, in which there is a top electrical contact 404 and a bottom electrical contact 408. The LED is formed in the semiconductor material 402 with an electrically conducting substrate 401. The light transmitting surface 403 permits light to be emitted 407. Light transmitting surface 403 also has an electrical contact 404. In this illustration, light is emitted when contacts 404 and 408 are properly biased (i.e., there is a proper voltage difference between the metal contacts, stipulated by the forward voltage of the LED). In an alternate construction, the polarity of contacts 403 and 408 may be reversed. The semiconducting material 402 can be made from gallium nitride bonded to electrically conducting silicon layer 401. Electrical contacts 404 and 408 can be thin layers of chromium over coated with nickel then gold. FIG. 4 is intended to show the schematic functional components but not the internal semiconductor layers.

FIGS. 5a-5e shows some examples of possible configurations for the arrangement of LED 104 where one or more LEDs are connected in an electrical arrangement to as to achieve the necessary forward voltage and current characteristics. In one embodiment, more than one LED is electrically connected to achieve a higher forward voltage than the forward voltage of any single LED itself. Increasing the forward voltage is advantage to reduce current draw while maintaining a fixed overall power. System with low forward voltage and high current of the same fixed power are electrically inefficiency due to the resistive loss in the wiring and other electrical connections. In addition the combined higher forward voltage of the LED arrangement typically provided for an improved power factor and efficiency characteristics for the LED system. In one embodiment, the forward voltage of the LED arrangement is greater than or equal to 35 percent, greater than or equal to 50 percent, or equal to 70 percent of the peak AC voltage. The benefits of increasing forward voltage for power factor and efficiency are the subject matter of another patent application, U.S. patent application Ser. No. 12/494,685, filed Jun. 30, 2009, which is incorporated by reference along with all other references cited in this patent. U.S. patent application Ser. Nos. 12/494,705, filed Jun. 30, 2009; 12/494,746, filed Jun. 30, 2009; 12/494,787, filed Jun. 30, 2009; 61/186,281, filed Jun. 11, 2009; 61/219,208, filed Jun. 22, 2009; and 61/219,571, filed Jun. 23, 2009, are also incorporated by reference.

Arrangement of LEDs 104 may be connected in series 500 (i.e., all the LEDs are oriented in the same direction, and the end of one LED $L_1$ is connected to the end of another LED $L_2$, but the other end of LED $L_1$ cannot be connected to the other end of LED $L_2$), in parallel 501 (i.e., all the one end of all the LEDs, e.g., the p side, are all form one node, while the other end of all the LEDs, e.g., the n sides, all the n side are connected to another node), or series-parallel combinations. Groups of parallel LEDs 501 may then be connected in series 502.

Likewise, groups of series LEDs 500 may then be connected in parallel 503. This invention encompasses any combination of LEDs. Additionally, and array of n LEDs may also connected in series (i.e., all the LEDs are oriented in the same direction, and the end of one LED $L_1$ is connected to the end of another LED $L_2$, but the other end of LED $L_1$ cannot be connected to the other end of LED $L_2$).

The arrangement of LEDs 500, 501, 502, 504, or 504 can be multiple individual LED dies on a substrate such as chip on board, or all the LEDs may be formed on the same die.

Figure 6:
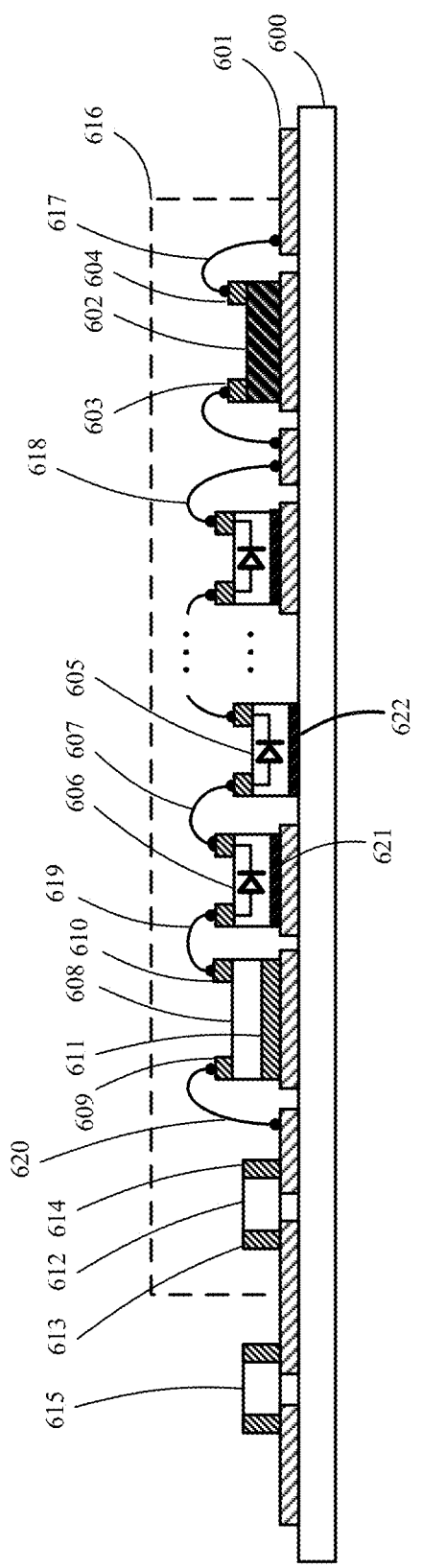
FIG. 6 is a diagram of a chip on board (COB) system embodiment of the invention containing multiple semiconductor dies, each with a lateral structure LED.

FIG. 6 shows a chip on board (COB) embodiment of the invention containing an electrically insulating substrate 600 with a conductive pattern 601. The embodiment contains at least one lateral semiconductor die 605 or 606 of the type in FIG. 2 and at least one silicon die 602. The silicon die 602 contains at least one rectifying element. The LED die is electrically connected to the silicon die through the conductive pattern 601 or wire bonds 618, or both. Whenever a wire bond connection is mentioned in this document, it refers to the connection made by the wire bond such that there is an electrical connection formed between the metal contact 204, 205, or 404 of one die with the metal contact 204, 205, or 404 of another die. LED die 605 and 606 and silicon die 602 are encapsulated in a light transmitting medium 616.

Substrate 600 may be fabricated from a ceramic material such as alumina, aluminum nitride, or beryllium oxide. Conductive pattern 601 may be a thin coating of a metal such as a layer of chromium, over coated with nickel, then over coated with gold. Conductive pattern 601 can also be fabricated using a thick film process such as screen printing. These metal layers are typically less than a few microns thick. Packaging technologies such as thick film, thin film, and thick copper metallization are document chapters 1-5 of textbook "Hybrid Microelectronics Handbook" by Harper & Sergent, published by McGraw-Hill Companies, 2, Jul. 1, 1995, and is incorporated by reference.

Alternatively substrate 600 and conductive pattern 601 may be fabricated from standard PCB or flex circuit processes. Substrate 600 can be made of FR4, flexible polyamide, or other materials from in the printed circuit boards (PCB) industry. Conductive pattern 601 is typically a copper foil laminated onto the substrate and patterned.

In another embodiment, substrate 600 need not be entirely insulating, but may be made of a metal material such as aluminum with a thin insulating layer to which conductive pattern 601 is bonded. Such construction is commonly known as metal clad board (MCB) or metal clad PCB (MCPCB) and available from companies such as Bergeist under the trade name THERMAL CLAD. In an alternate implementation of the substrate, the thin insulating layer can be aluminum oxide on an aluminum base. The conductive pattern can be screen printed onto the insulating aluminum oxide layer. Such substrates go by the trade name ANOTHERM, available from the IRC Advanced Film Division, a TT electronics company.

Encapsulation 616 is used to protect the LED dies 605 and 606, the silicon die 602 and wire bonds 607, 617, 618, 619, and 620. Encapsulation 616 transmits light but need not be entirely transparent. Encapsulation 616 may contain phosphors particles or light dispersing particles such as silica or titanium dioxide. Encapsulation 616 can be made of silicone, PMMA (polymethyl methacrylate), acrylic, polycarbonate, epoxy, and others.

There may be other electrical components 608 and 612 within the encapsulant such as resistors, capacitors, inductors, diodes, and the like. Component 612 is a surface mount component (SMC) with electrical contacts 613 and 614 attached to conductive pattern 601 using a conductive adhesive such as silver epoxy or solder. Component 608 has top contacts like 609 and 610 and bottom contacts like 611 where the top contacts are connected to other components via wire bonds 619 and 620 and the bottom contact 611 is bonded via conductive adhesive or solder to conductive pattern 601.

Semiconductor die 606 can be bonded to conductive pattern 601 using an adhesive such as silver epoxy or a solder. Alternatively, semiconductor die 605 can be bonded directly to insulating substrate 600 using an adhesive that is preferably thermally conductive.

There may be other electrical components 615 bonded to the conductive pattern 601 or substrate 600 but outside encapsulation 616.

Figure 7:
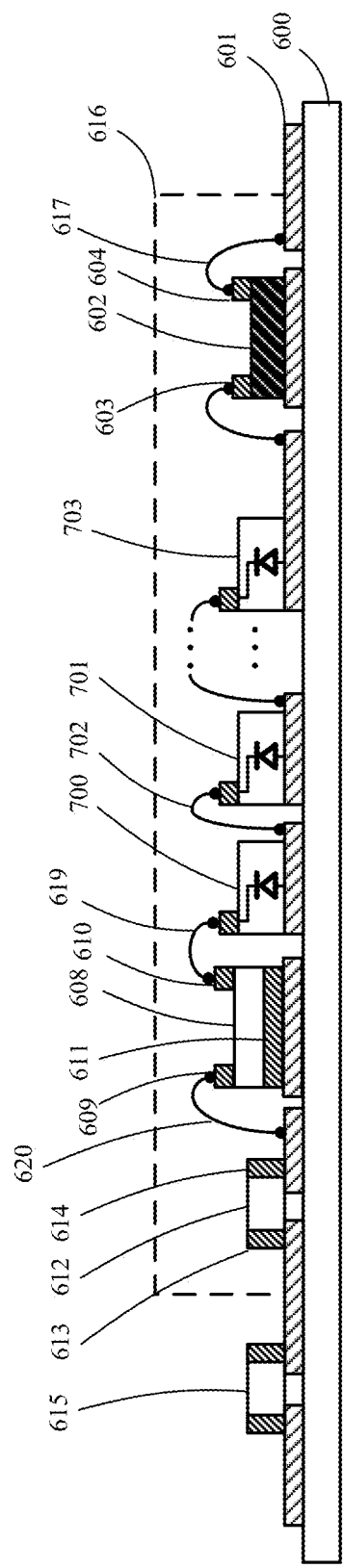
FIG. 7 is a diagram, similar to FIG. 6, constructed according to another embodiment of the invention, containing multiple semiconductor dies, each with a vertical structure LED.

FIG. 7 shows an alternative implementation similar to FIG. 6. Lateral LED die 605 and 606 are now replaced with at least one vertical structure LED die 700, 701, or 703 of the construction of FIG. 4. LED die 700 has top contact 404 and bottom contact 408. LED die 700 may electrically connected to another LED die 702 by connecting the top contact of one die 701 with the bottom contact of another die 700 via a wire bond 702. The LED may also be connected to other types of components 602 or 608, again be connecting any free contact (the top in some cases 700, the bottom in other cases 703) with the contact of another die via a wire bond 619 or 603. LED bottom contact 408 is electrically connected to conductive pattern 601 during the attachment process. The attachment of LED die 700 can be done using an electrically conductive adhesive such as silver epoxy or solder.

Figure 8:
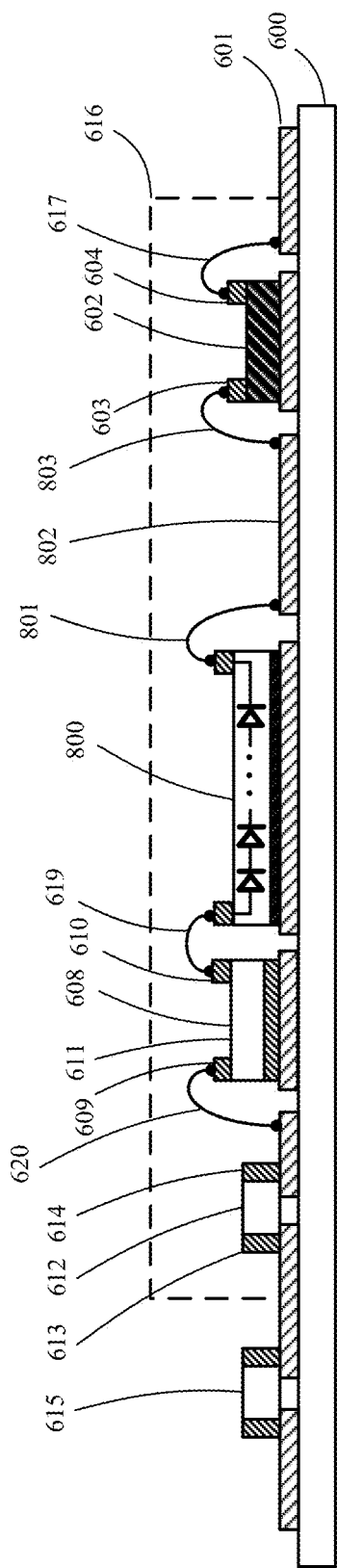
FIG. 8 is a diagram, similar to FIG. 6, constructed according to another embodiment of the invention, containing a semiconductor die with multiple lateral structure LEDs.

FIG. 8 shows an alternative implementation similar to FIG. 6 but with at least one lateral semiconductor die 800 containing at least two LEDs of the construction discussed previously for FIG. 3. LED die 800 is either bonded to the conductive pattern 601 as shown using conductive epoxy or solder, or alternatively LED die 800 is directly bonded to the insulating substrate 600 using an adhesive, in the same fashion as for 622. The adhesive is preferably thermally conductive. LED 800 has two contacts in the top layer 204 and 205 that is used to connect to other components. LED 800 may be connected to some components 608 via wire bond 619, by forming a connection between the metal contact of one die with the metal contact of another component. The LED may also be connected to other components 602 by forming a connection with a portion of the electrical conductive pattern 802 via the wire bond 801. The component to which LED 800 is connected must also form a connection via wire bond 803 to the same portion of the electrical conductive pattern 802 to ensure an electrical connection.

FIGS. 9-11 are constructed according to another embodiment of this invention, in which at least one semiconductor die, containing at least one LED, is mounted directly on top of the silicon die. The silicon die contains at least one rectifying element. The semiconductor die has a light emitting surface that also contains at least one electrical contact (i.e., it may be of the lateral or vertical construction).

FIG. 9 shows one implementation 900 using at least one lateral semiconductor die 903 or 904 of the construction previously described in FIG. 2, bonded to the silicon die 901 using a conductive epoxy or solder. Silicon die 901 has an electrically conductive pattern 902. The conductive pattern can be formed using a thin film metallization process. The metallization layers can be chromium, nickel, and gold. As previously described, a standard technique for metallization such as chemical vapor deposition or sputtering can be used.

LED die 903 or 904 can be bonded with an electrically conductive adhesive or soldered to the electrical pattern 902. The LED can alternatively be bonded using (preferably) a thermally conductive adhesive to silicon die 901. The LED die 903 or 904 may be connected to each other via wire bonds 905 that connect the contact from one die to the contact of another die. The LED die 904 may also be connected to other components via wire bond 908 by connecting any free contact of the die to one region of the conductive pattern 902, on which is bonded (i.e., electrically connected) the other component 907. Wire bond 906 connects LED die 903 to the silicon die 901.

Any number of additional components may be bonded to the silicon die. The other electrical components can be surface mountable components such as capacitors, resistors, inductors, or diodes (e.g., ESD, Zener, or any other type of diode), or any combination of these. The silicon die may itself contain other useful circuitry such as Zener diodes, resistors, or capacitors.

FIG. 10, similar to FIG. 9, shows another implementation 1000, where at least one semiconductor die 1001 or 1002 contains a vertical structure LED of the construction previously described in FIG. 4 with a top electrical contact 403 and a bottom electrical contact 408. Top electrical contact 403 may be connected to the electrically conductive pattern 902 via a wire bond 1003 or 1004. This is how LED die 1001 and 1002 are connected to each other and the silicon die. Because the LED dies 1001 and 1002 are oriented with one contact at the top of the die and another on the bottom (bonded on the conductive pattern), other components 907 may be bonded to conductive pattern 902 to form electrical connections, if they reside in the same region of conductive pattern 901 as does LED die 1002. The methods and properties of these components are the same as those in FIG. 9, except the LED die 1001 and 1002, as noted.

FIG. 11, similar to FIG. 9, shows another implementation 1100 where at least one semiconductor die 1101 contains at least two lateral structure LEDs previously described in FIG. 3. LED die 1101 has contacts in the top layer connected to electrical pattern 902 via the wire bonds 1102 or 1103. As described in FIG. 9, LED die 1101 is connected to other components 907 via the wire bond 1103, by connecting the contact of the LED and the region of conductive pattern 902 on which resides the other component 907.

Figure 12:
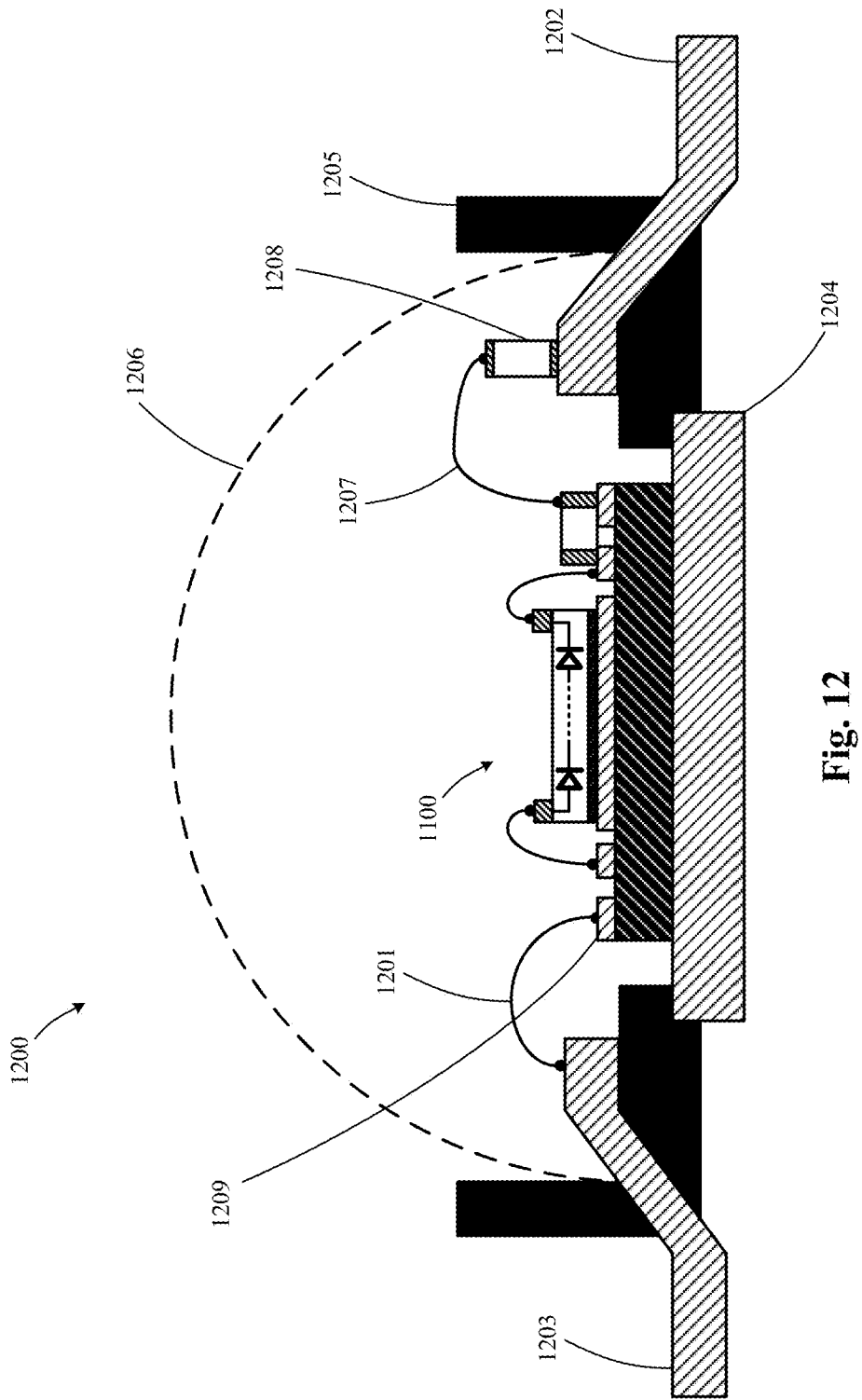
FIG. 12 is a diagram of a LED system mounted on a silicon die and incorporated into a lead frame package with a convex lens.
Figure 13:
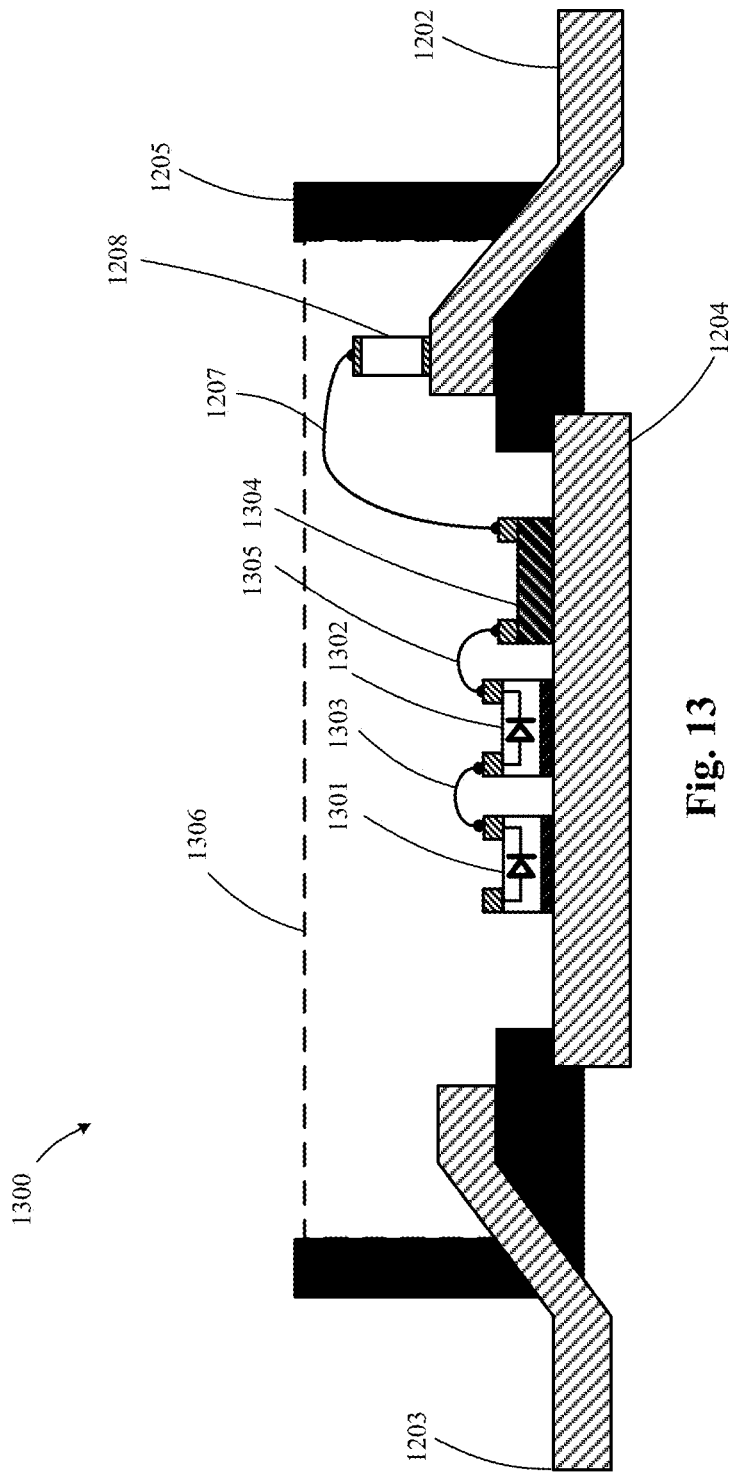
FIG. 13 is a diagram, similar to FIG. 12, of a LED system mounted on a silicon die and incorporated into a lead frame package with a flat lens.
Figure 14:
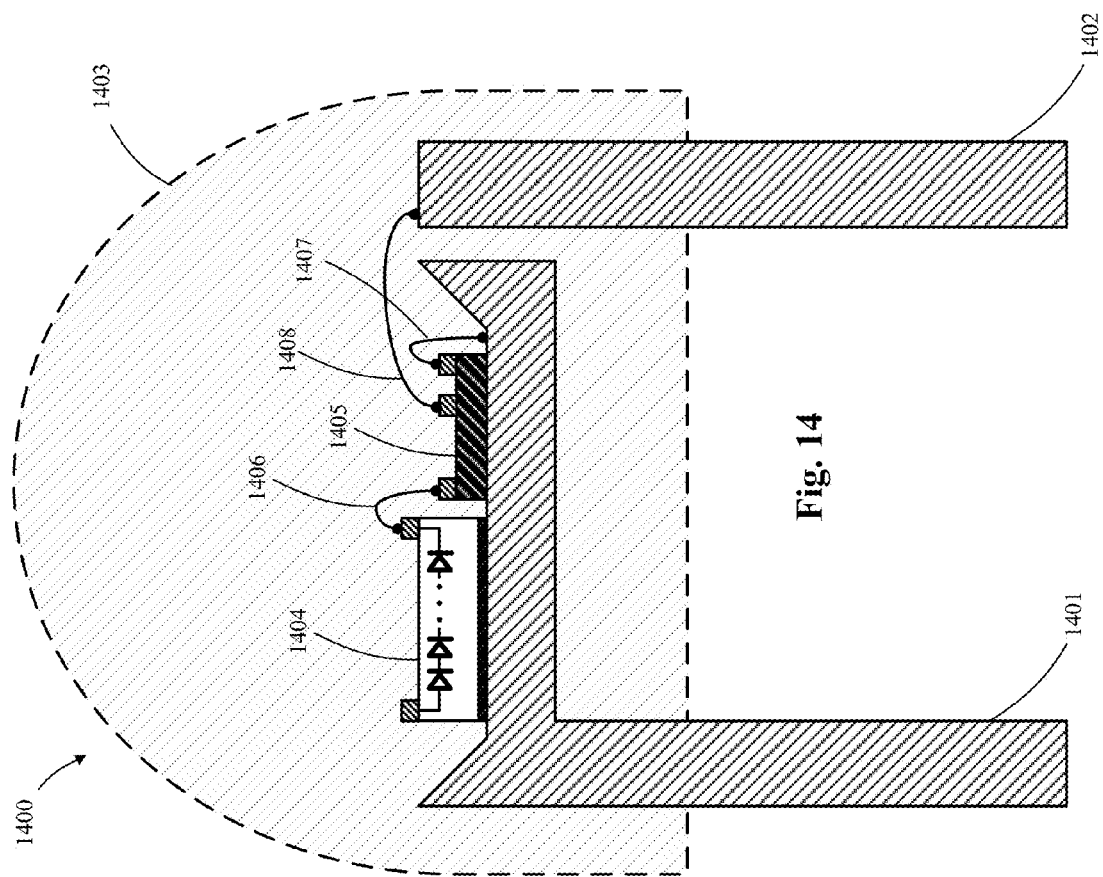
FIG. 14 is a diagram, similar to FIG. 12, constructed according to another embodiment of the invention, is a LED system incorporated into a lead frame package with electrical leads.

FIGS. 12, 13, and 14 depict the compact implementations of encapsulated lead frame packages with the LED modules 900, 1000, or 1100 and LED structures 200, 300, or 400 to support use of the invention in myriad applications. In other words, there is an abstraction that enables users of the invention to connect the leads of the package to an AC source to power the LED. The encapsulation does not need to be completely transparent as long as it supports transmission of light.

FIG. 12 shows LED module 1100 incorporated into a lead frame package 1200. Alternatively LED module 1100 can be replaced with LED module 900 or 1000. Lead frame package 1200 consists of a metal element 1204 and metal conductive leads 1202 and 1203. LED module 1100 is bonded to metal element 1204 using a solder or an adhesive that is preferably thermally conductive. The lead frame elements 1202, 1203, and 1204 are electrically isolated from each other by electrically insulating material 1205. A metal material such as Kovar or copper may be used for lead frame elements 1202, 1203, and 1204, and a plastic may be used for insulating material 1205. LED module 1100 is electrically connected to metal conductive leads 1202 and 1203 via wire bonds 1201 and 1207 by forming a connection between the contact of LED die of module 1100 and the conductive pattern 1209. A connection must also be formed between conductive pattern 1209 and lead 1203. Optionally, there may be other components 1208 such resistors, capacitors, and inductors, and diodes (ESD or Zener) connected to the lead frame. LED module 1100 may be encapsulated within a convex lens 1206.

FIG. 13 shows an embodiment of a LED module 1300 containing a lead frame package, at least one semiconductor die 1301 or 1302 and a silicon die 1304, which are encapsulated by a flat lens 1306, also a light transmitting medium. Silicon die 1304 contains at least one rectifying element. Semiconductor die 1302 is electrically connected other semiconductor die 1301 via wire bond 1303 or other components such as silicon die 1304 via wire bond 1305. Semiconductor die 1301 or 1302 contains at least one LED of the construction previously described in FIG. 2, 3, or 4. For example, Semiconductor dies 1301 and 1302 contain lateral or vertical structure LEDs of FIG. 2 or 3 and bonded to frame 1204 using a solder or an adhesive that is preferably thermally conductive.

FIG. 14 shows another implementation. LED module 1400 contains a lead frame package, at least one semiconductor die 1404 and silicon die 1405, and are encapsulated 1403. In this implementation of the lead frame package, there are electrical leads 1401 and 1402. Lead 1401 also provides a mounting surface to bond semiconductor die 1404 and silicon die 1405. LED die 1404 is electrically connected to other components 1405 (which may be other LED die) via wire bond 1406. Silicon die 1405 is electrically connected to the leads 1401 and 1402 via wire bonds 1407 1408. The LED is of the lateral type of FIG. 2 or 4. In other implementations, vertical type LEDs may be used, and vertical LEDs may be used in combination with lateral type LEDs. Semiconductor die 1404 contains at least one LED of the construction previously described in FIG. 2, 3, or 4. Convex encapsulation 1403 serves as an optically transmitting medium as well as a mechanical means to hold the leads 1401 and 1402.

Figure 15:
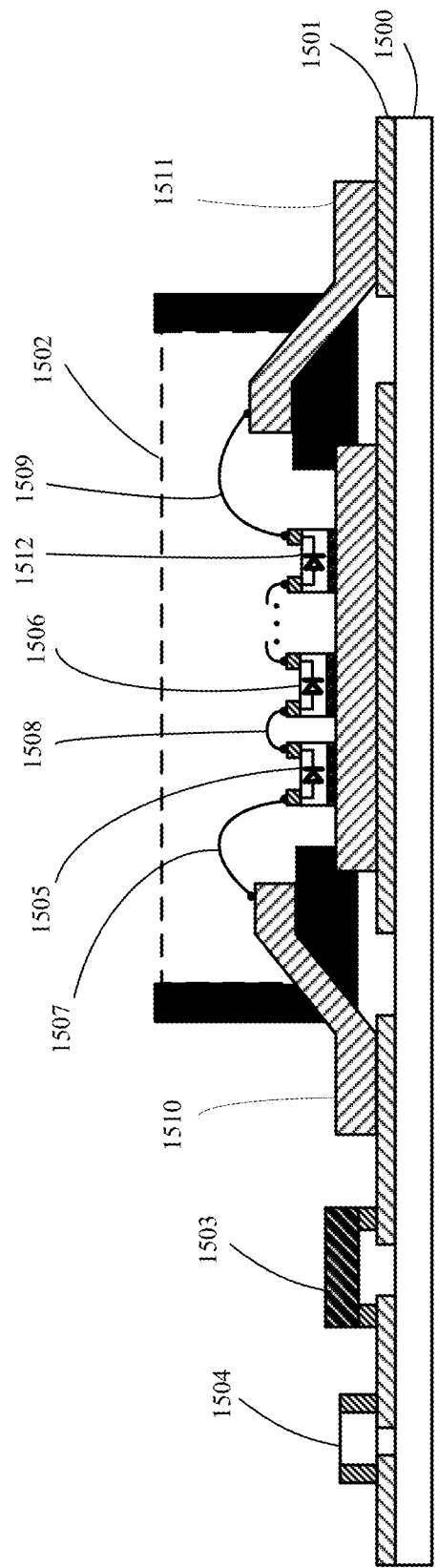
FIG. 15 is a diagram of a LED system containing multiple semiconductor dies incorporated into a lead frame package, and then mounted on an electrical circuit.

FIG. 15 shows an alternate compact implementation including at least one LED package 1502 (e.g., with lateral or vertical structured LEDs). The LEDs in the LED packaged are connected in series between an electrical terminal or lead 1510 and 1511. Specifically, for example, the LED package has at least two LEDs 1505 and 1506 electrically connected together via wire bonds 1508. First LED 1505 is connected to lead 1510 using a wire bond 1507 and to second LED 1506 using a wire bond 1508. A last LED 1512 in the series is connected to lead 1511 using a wire bond 1509.

A bottom layer 1500 is an insulating substrate. The layer above the bottom layer is a conductive pattern 1501. LED package 1502, a stand-alone rectifying element 1503, and a current limiting element 1504 in its own package are bonded to this layer.

The components are bonded through soldering or an electrically conductive epoxy (e.g., silver epoxy). LED package 1502 is intended to be very general for the purposes of this invention, as long as it contains at least two LEDs. Other possible package types containing more than one LED are available from Cree, Osram, Lumileds, Nichia, and Bridgelux, and are incorporated by reference. The material and fabrication process for substrate 1500 and conductive layer 1501 can be PCB or MCPCB. All the processes and material for the previously described for insulating substrate 600 and conductive pattern 601 can be applied to insulating substrate 1500 and conductive pattern 1501. The current limiting element 1504 is a capacitor or resistor 111 in series with the AC input source 100.

Figure 16:
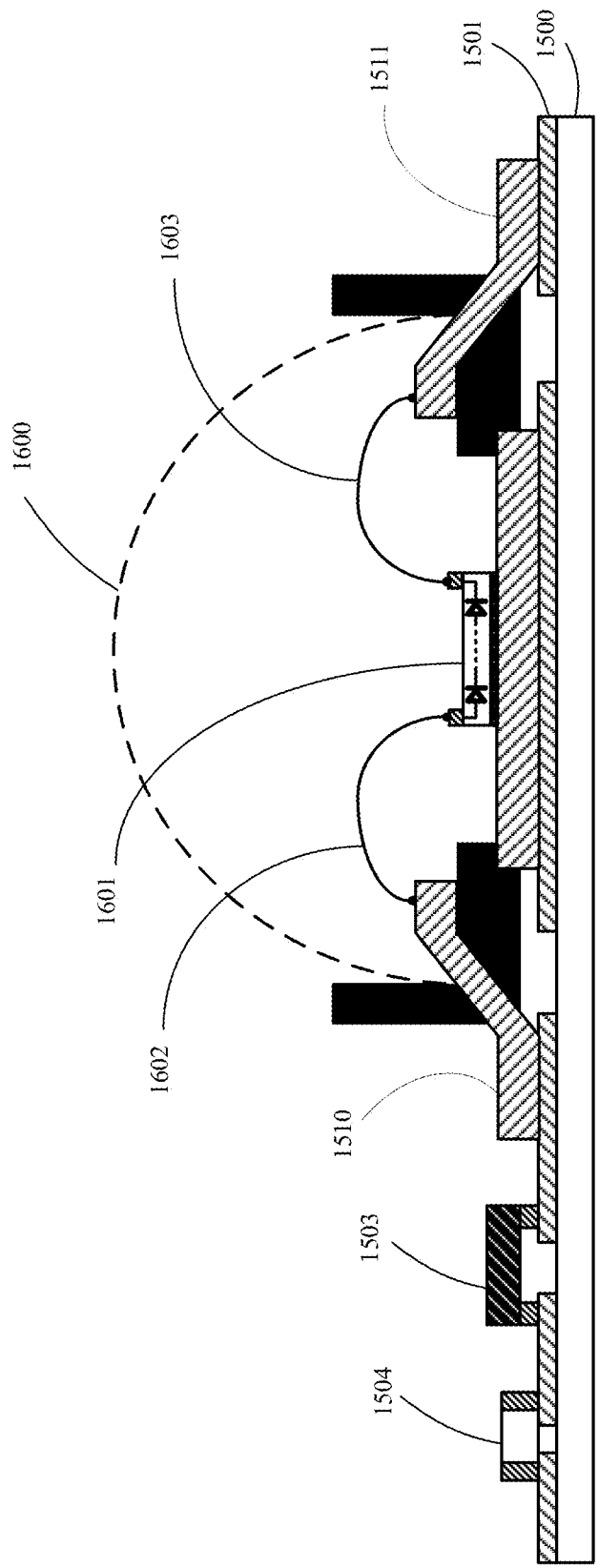
FIG. 16 is a diagram, similar to FIG. 15, of a LED system incorporated into a lead frame package with a convex lens, and then mounted on an electrical circuit.

FIG. 16 shows a variation of FIG. 15, in which the module contains at least a package with a convex lens 1600, the package contains at least one semiconductor die 1601, which contains at least two LEDs of the type in FIG. 3. The LEDs are electrically connected to each other and to the metal conductive leads 1510 and 1511 by wire bonds 1602 and 1603 in the manner described for FIG. 15. All other properties of this embodiment of the figure are the same as those of FIG. 15.

An LED requires DC current to function. A rectifier can be used to transform an AC voltage source into a DC voltage source. To limit the current from DC voltage source a current limiting component such as a resistor or capacitor in series with the AC voltage source can be used. The disadvantage is the additional space and cost necessary for the extra level of packaging where the LED and rectifier are attached to the PCB. In addition, for certain designs where multiple LEDs are required to achieve a higher forward voltage, significantly more space is required to accommodate the multiple individual LED packages.

Another technique is to use LEDs themselves as rectifiers. However in this implementation the LEDs must have good reverse voltage characteristics which may be difficult to achieve for high voltage applications. In another technique, two strings of LEDs are connected together in an inverse parallel arrangement. Each string of LED lights up on alternating halves of the AC cycle. A separate current limiting element such as a capacitor, or resistor, or both is usually placed in series. The advantage is the elimination of a separate silicon rectifier. However, now twice as many LEDs are necessary.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A system comprising a packaged component comprising:
    an AC power input to the packaged component;
    a first die comprising a first light emitting diode;
    a second die comprising of a second light emitting diode;
    a third die comprising a silicon rectifying element,
        wherein the third die is electrically coupled to the first and second die,
    the first and second dies are electrically coupled to produce a combined forward voltage greater than the forward voltage of either the first or second die,
    a first current limiting element, comprising a first terminal coupled to the AC power input and a second terminal coupled to the rectifying element, and
    the first, second, and third dies are formed on a one side of a planar substrate; and
    a second current limiting element, comprising a first terminal coupled to the rectifying element and a second terminal coupled to the second light emitting diode.

2. The system of claim 1 wherein the first current limiting element comprises a resistor.

3. The system of claim 1 wherein the first current limiting element comprises a capacitor.

4. The system of claim 1 wherein the first and second dies and the rectifying element are encapsulated together using a light transmitting medium.

5. The system of claim 1 wherein the first and second dies are encapsulated together using a first medium, and the rectifying element is encapsulated using a second medium, wherein the second medium is separate from the first medium.

6. The system of claim 5 wherein the first medium is light transmitting.

7. A system comprising a packaged component comprising:
an AC power input to the packaged component;
a first die comprising a first light emitting diode;
a second die comprising of a second light emitting diode; and
a third die comprising a silicon rectifying element,
wherein the third die is electrically coupled to the first and second die,
the first and second dies are electrically coupled to produce a combined forward voltage greater than the forward voltage of either the first or second die,
a current limiting element, comprising a first terminal coupled to a first node of the rectifying element and a second terminal coupled to a second node of the rectifying element,
the first and second dies are encapsulated together using a first medium, and the rectifying element is encapsulated using a second medium, wherein the second medium is separate from the first medium, and
the second medium is not light transmitting.

8. The system of claim 6 wherein the first die and the rectifying element are encapsulated together using a light transmitting medium.

9. The system of claim 1 wherein the first die is encapsulated using a first medium and the rectifying element is encapsulated using a second medium, wherein the second medium is separate from the first medium.

10. The system of claim 1 wherein the first and second light emitting diodes are coupled together in series.

11. The system of claim 1 wherein the first and second light emitting diodes are coupled together in parallel.

12. The system of claim 7 wherein the current limiting element comprises a resistor that is encapsulated in medium is not light transmitting.

13. A system comprising a packaged component comprising:
an AC power input to the packaged component;
a first die comprising a of a first light emitting diode;
a second die comprising of a second light emitting diode; and
a third die comprising a silicon rectifying element rectifier,
wherein the third die is electrically coupled to the first and second die,
the first and second dies are electrically coupled to produce a combined forward voltage greater than the forward voltage of either the first or second die,
a current limiting element, comprising a first terminal coupled to the AC power input and a second terminal coupled to the AC power input,
the first, second, and third dies are formed on a one side of a planar substrate, and
the first, second, and third dies are encapsulated together using a light transmitting medium.

14. The system of claim 13 wherein the light transmitting medium comprises a convex lens above the surface of the first, second, and third dies.

15. The system of claim 13 wherein the AC power input is coupled to the third die via a first wire bond, the third die is coupled to the first die via a second wire bond, and the first die is coupled to the second die via a third wire bond.

16. The system of claim 13 wherein the first die comprises a third light emitting diode coupled in series with the first light emitting diode.

17. The system of claim 13 wherein the first terminal of the current limiting element is coupled to a positive electrode of the AC power input and the second terminal of the current limiting element is coupled to a negative electrode of the AC power input.

18. The system of claim 7 wherein the second terminal of the current limiting element is coupled to the first light emitting diode.

19. The system of claim 7 wherein the current limiting element is a first the current limiting element, and the system comprises:
a second current limiting element, comprising a first terminal coupled to the rectifying element and a second terminal coupled to the second light emitting diode.

20. The system of claim 1 wherein the first terminal of the second current limiting element is coupled to the first light emitting diode.

* * * * *